United States Patent [19]

Pelletier, Jacques H. et al.

[11] Patent Number: 5,227,695

[45] Date of Patent: Jul. 13, 1993

[54] DEVICE FOR COUPLING MICROWAVE ENERGY WITH AN EXCITER AND FOR DISTRIBUTING IT THEREALONG FOR THE PURPOSE OF PRODUCING A PLASMA

[75] Inventors: Pelletier, Jacques H., Saint Martin d'Heres; Yves A. M. Arnal, Poisat; Michel Pichot, Grenoble, all of France

[73] Assignees: Centre National de la Recherche Scientifique, Paris; L'Etat Francais, represents par aux Postes et Telecommunications, Issy les Moulineaux, France

[21] Appl. No.: 860,555

[22] Filed: Mar. 30, 1992

Related U.S. Application Data

[63] Continuation of Ser. No. 533,339, Jun. 5, 1990, abandoned.

[30] Foreign Application Priority Data

Jun. 5, 1989 [FR] France .................. 89 07627

[51] Int. Cl.$^5$ ............................................. H04H 1/46
[52] U.S. Cl. ........................... 315/111.21; 315/111.41; 313/231.31
[58] Field of Search ............. 315/111.21, 111.41, 315/111.71, 111.81; 313/231.31; 250/423 R

[56] References Cited

U.S. PATENT DOCUMENTS

| | | | |
|---|---|---|---|
| 4,473,736 | 9/1984 | Bloyet et al. | 315/111.21 X |
| 4,609,808 | 9/1986 | Bloyet et al. | 315/111.21 X |
| 4,713,585 | 12/1987 | Ohno et al. | 315/111.21 X |
| 4,727,293 | 2/1988 | Asmussen et al. | 315/111.41 |
| 4,745,337 | 5/1988 | Pichot et al. | 315/111.21 X |
| 4,866,346 | 9/1989 | Gaudreau et al. | 315/111.21 |
| 4,902,099 | 2/1990 | Okamoto et al. | 315/111.21 X |
| 4,902,934 | 2/1990 | Miyamura et al. | 315/111.21 |
| 4,906,900 | 3/1990 | Asmussen | 315/111.41 X |

FOREIGN PATENT DOCUMENTS 0209469 1/1987 European Pat. Off. .

OTHER PUBLICATIONS

M. Pichot and A. Durander, "Mocrowave Multiplier Plasmas Excited by Distributed Electron Cyclotron Resonance: Concept and Performance", Rev. Sci. Instrum., vol. 59, No. 7, Jul. 1988, pp. 1072–1075.

Primary Examiner—Eugene R. LaRoche
Assistant Examiner—Do Hyun You
Attorney, Agent, or Firm—Bacon & Thomas

[57] ABSTRACT

A device for coupling microwave energy with at least one exciter, and for distributing it therealong for the purpose of producing a plasma, includes a first enclosure whose inside is bathed in microwave energy, a second enclosure containing a gaseous medium to be ionized, and a first series of at least one communication passage between the two enclosures. An exciter is mounted to pass through each communication passage at a distance from the inside surfaces and to extend into the first and second enclosures in order to couple with a portion of the microwave energy and convey the coupled microwave energy locally into association with the gaseous medium. The exciter constitutes, together with the passage and portions of the sidewalls of the enclosures facing the exciter, a coaxial-type structure.

16 Claims, 4 Drawing Sheets

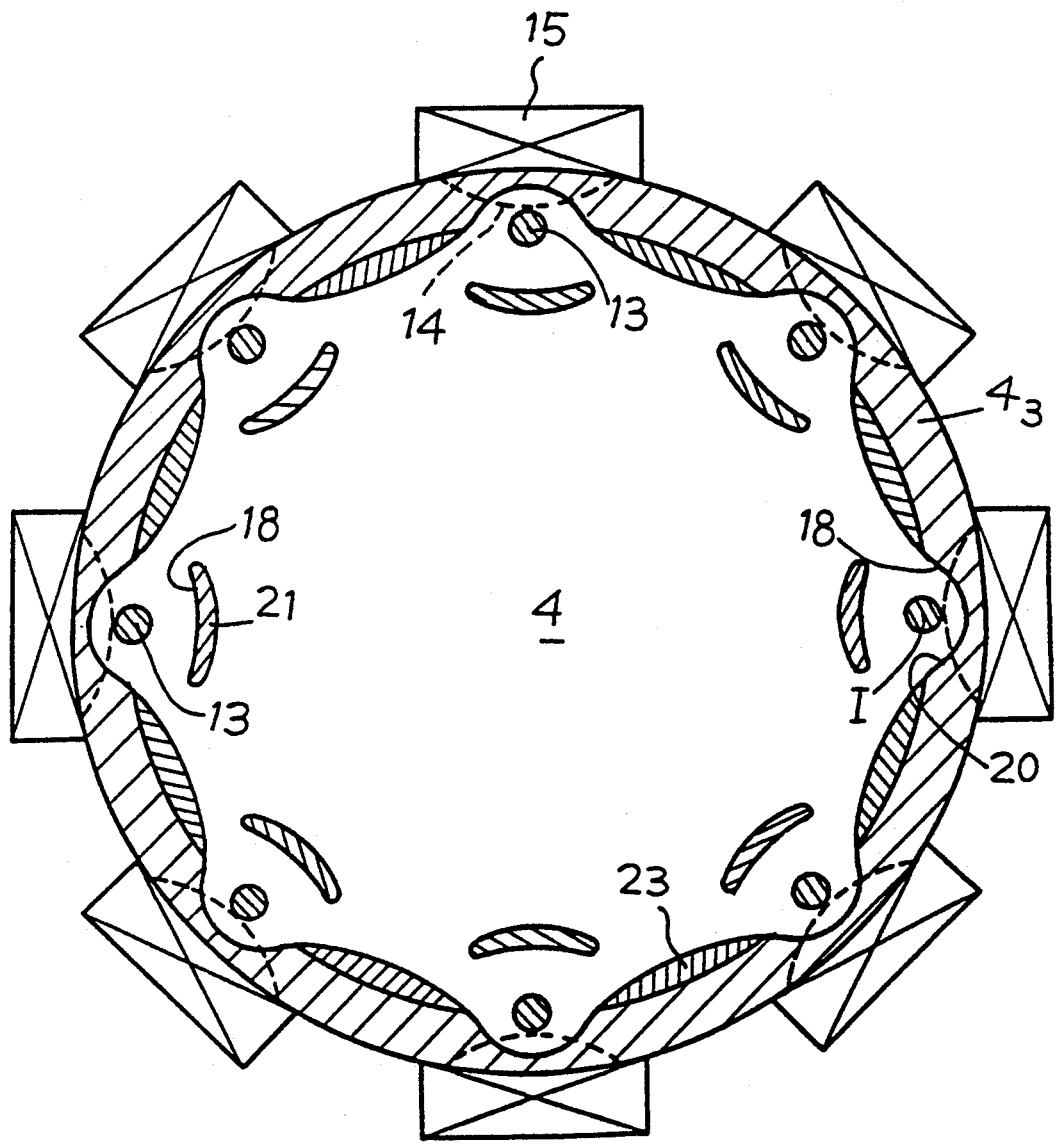

DEVICE FOR COUPLING MICROWAVE ENERGY WITH AN EXCITER AND FOR DISTRIBUTING IT THEREALONG FOR THE PURPOSE OF PRODUCING A PLASMA

This application is a continuation of application Ser. No. 07/533,339, filed Jun. 5, 1990, abandoned.

The present invention relates to the general technical field of producing a plasma from any type of gaseous medium, for a very wide range of applications, such a surface treatments or producing beams of ions.

The invention relates, more particularly, to the field of exciting a plasma by means of microwaves, in particular by electron cyclotron resonance.

BACKGROUND OF THE INVENTION

French patent application number 85 08 836 describes a technique for exciting a plasma by electron cyclotron resonance. This resonance is obtained for a magnetic field B and an excitation frequency f which are related by the equation:

$$B = 2\pi mf/e$$

where m and e are the mass and the charge of an electron. For example, at a frequency of 2.45 GHz, a magnetic field of 0.0875 Tesla is required to obtain resonance.

The technique described in the above-mentioned French patent application requires permanent magnets to be used each creating a surface having a constant magnetic field at a strength corresponding to electron cyclotron resonance. Electromagnetic energy is conveyed to the resonance zone by plasma exciters, each constituted by a length of metal wire. Each exciter is disposed inside a plasma reactor in association with permanent magnets which are mounted on the wall of the reactor.

Given that the plasma excited by this technique operates at low pressure (about one-tenth of a pascal, 0.1 pascal), the microwave energy is injected into the reactor via a sealed feedthrough including a connection element which is electrically insulated from the hole it passes through so as to constitute a coaxial type of structure. The connection element is connected on the inside of the enclosure to an exciter, and on the outside of the enclosure to the core of a coaxial cable conveying electromagnetic energy, for example.

When using such an enclosure fitted with a set of exciters, each of the exciters must be fed either from a single microwave source or else from a plurality of independent sources. When a plurality of sources are used, each exciter is associated with at least one microwave source via impedance matching means and possibly via measuring means. When a single source is used, it is necessary to use at least one microwave energy distributor associated with impedance matching means and measuring means. It turns out that using such a technique is not entirely satisfactory in practice.

A first drawback concerns the microwave energy distributors which are generally constituted by coaxial connectors in which the central core penetrates to a greater or lesser extent either into a waveguide or else into a microwave cavity. Except under special circumstances, the positions of the coaxial connectors are complex and need to be calculated by computer. Further, it is difficult to balance the various coaxial connectors relative to one another and numerous successive adjustments are required on the depth of penetration of each connector.

Additional drawbacks of this technique are related to implementing sealed coaxial type feedthroughs for feeding microwave energy into the plasma excitation zone.

Thus, the connections of the connection element of the feedthrough with both the coaxial cable core and the exciter are sources of impedance discontinuity and of heating, thereby giving rise to energy losses.

In addition, the dielectric in the feedthroughs facing the plasma is subjected simultaneously to heating due to the plasma and to contamination due to plasma treatment. The higher microwave power for plasma excitation passing through the feedthrough, the greater the contamination. However, given that microwave energy is absorbed by plasma excitation and falls off with increasing distance from the feedthrough, it appears that the transmission of high power requires coaxial type feedthroughs to be made using difficult and expensive technology.

Further, the application of high microwave powers requires each exciter to be cooled effectively. The use of sealed feedthroughs makes full cooling of the exciters very difficult since cooling is generally obtained by a flow of cooling fluid injected from the free ends of the exciters. In reality, coaxial cables and feedthroughs can be cooled solely by conduction from the exciter. As a result, the acceptable microwave power is limited by the efficiency with which each of the exciters is cooled, and by the power performance of the dielectric used to make the coaxial type feedthroughs.

Another drawback of this plasma excitation technique relates to the way microwave power from the microwave source falls off progressively along the exciter. Microwaves can be propagated only with loss, and the density of the resulting plasma falls off together with the microwave power.

The present invention thus seeks to remedy the drawbacks mentioned above, by providing a device for coupling microwave energy with at least one exciter in such a manner as to obtain better coupling of the microwave energy.

An object of the invention is to provide a device for distribution microwave energy with a set of exciters making it possible to eliminate the use of coaxial type feedthroughs.

Another object of the invention is to provide a distributor device which distributes microwave energy along the entire length of an exciter.

SUMMARY OF THE INVENTION

In order to achieve the above-mentioned objects, the present invention provides a device coupling microwave energy with at least one exciter and for distributing it therealong for the purpose of producing a plasma, the device comprising:

a first enclosure whose inside is bathed in microwave energy;

a second enclosure containing a gaseous medium to be izonized;

a first series of at least one communication passage between the two enclosures; and an exciter mounted to pass through each communication passage at a distance from the inside surface thereof and to extend firstly at least inside the first enclosure to couple with a portion of the electromagnetic energy, and secondly at least inside the second enclosure to convey the coupled microwave energy locally into association with the gaseous medium, such that the exciter constitutes, together with the passage and the portions of the walls of the enclosures facing the exciter, a coaxial type structure.

BRIEF DESCRIPTION OF THE DRAWINGS

Embodiments of the invention are described by way of example with reference to the accompanying drawings, in which:

FIG. 3 is a cross-section substantially on line III—III of FIG. 1.

DETAILED DESCRIPTION

Figure 1:
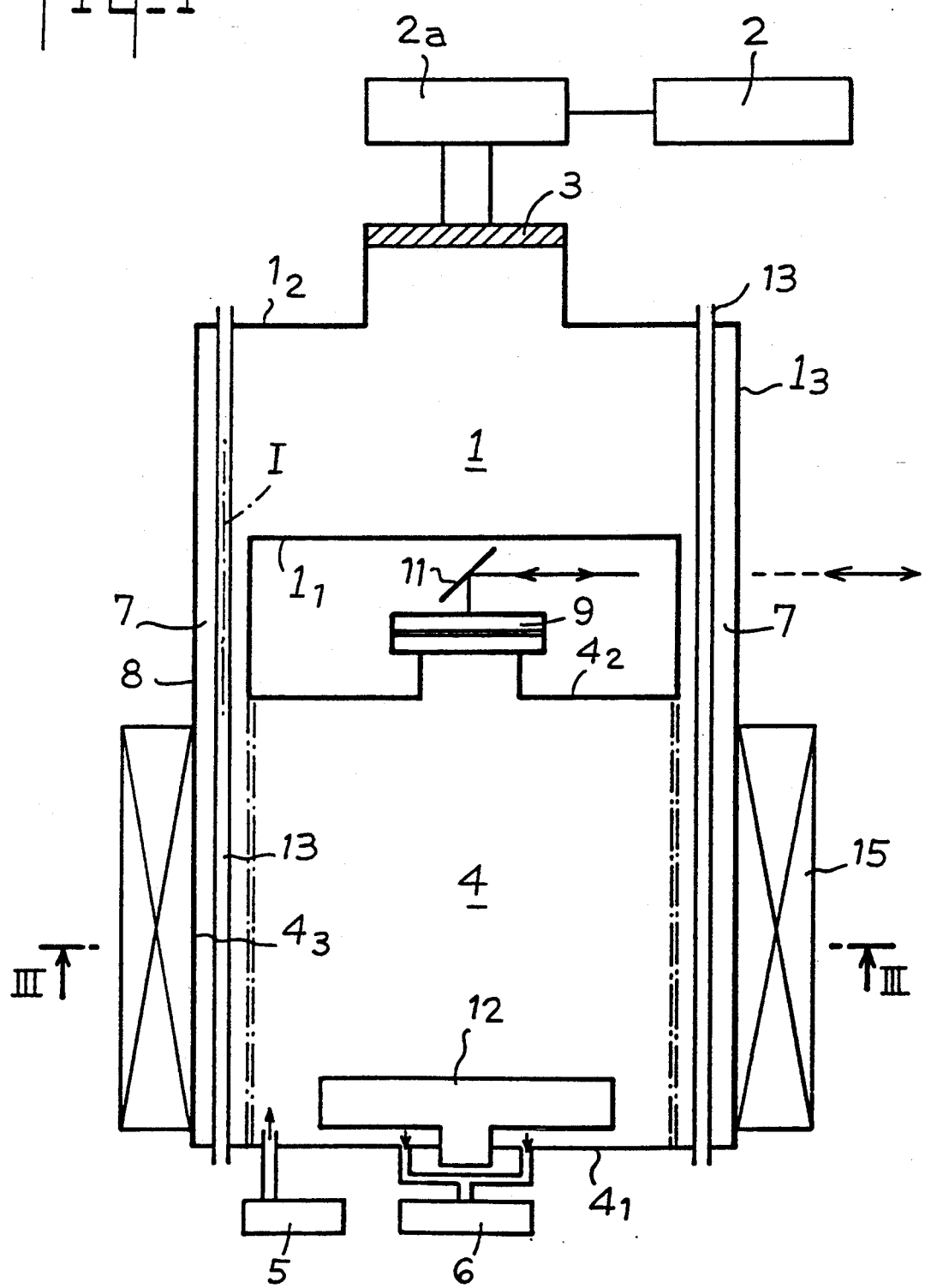
FIG. 1 is a diagram in radial section through an embodiment of a coupling device of the invention.

FIG. 1 shows an embodiment of a device in accordance with the invention for coupling and distributing microwave energy for the purpose of producing a plasma for a very wide range of applications, such as surface treatments or producing ion beams.

The device comprises a first metal enclosure 1 with its inside being bathed in microwave energy produced by any suitable conventional means, or being injected into the enclosure, as shown in the drawing. When injected, microwave power is provided by a generator 2 associated with an impedance matcher 2a, and is injected into the enclosure 1 via a sealed system 3, such as a dielectric window.

Figure 2A:
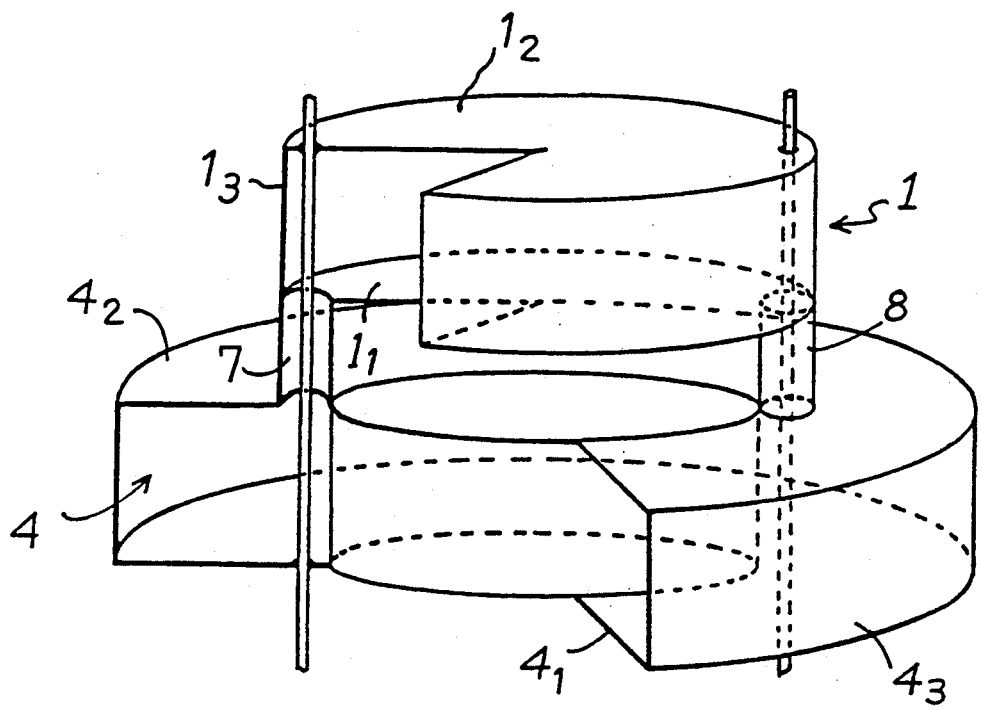
FIG. 2a is a cut-away perspective view of an embodiment of the invention.

The enclosure 1 has a bottom wall $1_1$ and a top wall $1_2$ interconnected by a side wall $1_3$, thereby preferably but not exclusively forming a cylindrical enclosure whose right cross-section is circular, as can be seen in FIG. 2a.

Figure 2B:
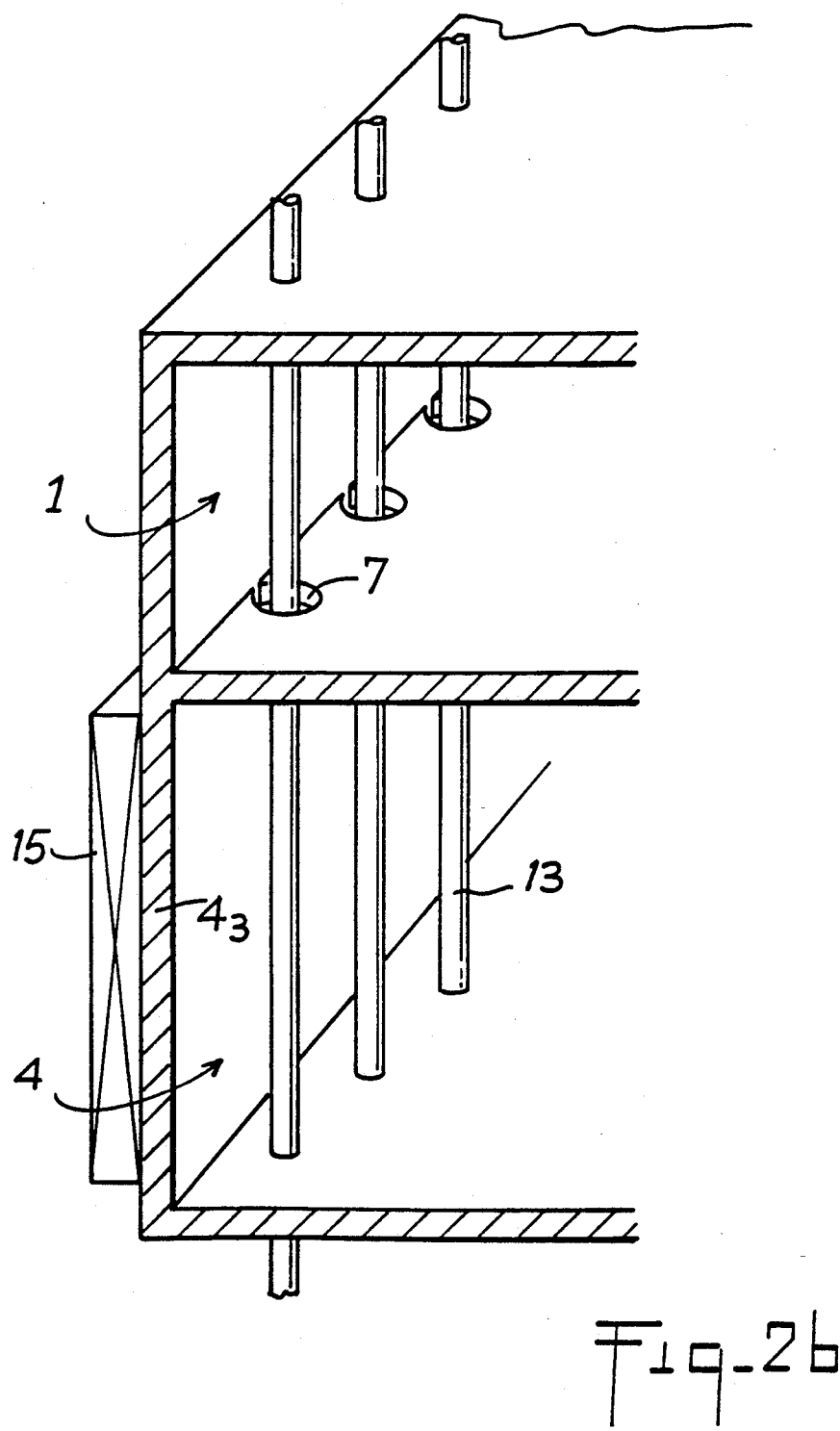
FIG. 2b is a fragmentary perspective view of a different embodiment of the invention.

The device of the invention also includes a second metal enclosure 4 containing a gaseous medium to be ionized, which medium is injected therein by appropriate conventional means 5. The enclosure 4 is also fitted with pump means 6 serving to maintain the pressure of the gas to be ionized at a desired value, which may be a few $10^{-3}$ pascals to a few pascals, for example, depending on the nature of the gas. The enclosure 4 is constituted by a bottom wall $4_1$ and a top wall $4_2$ interconnected by a side wall $4_3$ preferably, but not exclusively, suitable for forming an enclosure whose right cross-section is circular. The enclosure 4 whose function is described more clearly below may, in the general case, take up a variety of shapes, e.g. cylindrical (FIG. 1), toroidal (FIG. 2a), or including at least one plane face (FIG. 2b). Similarly, it must be understood that the enclosure 1 may take up a variety of shapes as described above with reference to any of the shapes given to the enclosure 4.

In the event that the enclosure 1 is toroidal in shape or includes at least one plane face, it is advantageous to use a ring resonator of conventional type having a travelling wave moving therealong.

In accordance with the invention, the enclosures 1 and 4 are interconnected by a first series of at least one communication passage 7, with each passage having a normal axis I extending at least close to the side walls of the enclosures 1 and 4. In the example shown, each communication passage 7 is constituted by a tubular duct 8 whose right cross-section is preferably, but not exclusively, circular. The tubular ducts whose function is described more clearly below, may be no longer than the combined thickness of the bottom wall $1_1$ and the top wall $4_2$ so that the two enclosures are immediately adjacent (FIG. 2b). However, the length of the tubular ducts 8 is preferably designed to enable the enclosures to be at a distance apart from each other, thereby enabling an observation window 9 to be installed in the top wall $4_2$ of the enclosure 4. The window 9 in association with an appropriate optical system 11 enables the inside volume of the enclosure 4 to be observed in which, for example, a sample carried by a carrier 12 may be subjected to surface treatment.

It should also be understood that the optical system 11 could alternatively pass through the middle of the enclosure 1, supposing said enclosure is toroidal in shape.

The enclosures 1 and 4 which together constitute a gastight structure may be made in various different ways, and in particular may constitute a single piece or else may be made separately so that the enclosures can be disassembled easily. Naturally the enclosures are made of metal and they may be covered with a dielectric or with a metal coating.

For each tubular communication duct 8, the device of the invention further includes a plasma exciter 13 constituted by a metal wire element capable of being covered with a dielectric or with a metal coating. Each exciter 13 is mounted to pass through one of the tubular ducts 8 at a distance from the inside surface of the ducts 8 so as to constitute a coaxial type of structure together with the duct. The exciter 13 which extends along a direction substantially parallel to the normal axis I may be offset relative to said axis, so long as it does not come into contact with the duct.

Each exciter extends from the inside of the first enclosure 1 close to its side wall $1_3$ in such a manner as to ensure that a portion of the microwave energy extending inside the enclosure 1 is coupled with the exciter, with the enclosure 1 thus serving the function of distributing energy over the set of exciters. Similarly, each exciter 13 also extends inside the second enclosure 4 in the vicinity of its side wall $4_3$, so that the microwave energy propagates all along the exciter.

Naturally one or more exciters 13 may be used, with the number of exciters being adapted to the maximum plasma density to be achieved. If several exciters are used, then they are distributed uniformly or otherwise around the periphery and along the walls of the enclosures.

In addition, the microwave energy distributing enclosure 1 must be large enough to prevent any interruption in microwave propagation and to enable a high degree of microwave coupling with the developed coaxial type structure formed on either side of the tubular duct 8 by the exciter and the corresponding portions of the enclosure walls $1_3$ and $4_3$ facing the exciter.

The microwave energy coupled inside the distribution enclosure 1 with the developed coaxial structures of the exciters 13 then propagates through the tubular ducts 8 and into the enclosure 4 on the developed coaxial structures of the exciters 13. Naturally, the dimensions of the tubular ducts 8 and of the exciters 13 are designed so as to avoid plasma excitation inside the tubular ducts under the intended operation conditions.

As can be seen more clearly in FIG. 3, and in accordance with French patent application 85 08 836, each exciter 13 is preferably positioned close to a surface 14 having a constant magnetic field at a strength corresponding to electron cyclotron resonance. This surface having a constant magnetic field is created by a magnet 15 mounted, for example, on the outside surface of the wall 4₃ and extending parallel to the corresponding exciter 13. In this configuration, each exciter 13 serves not only to propagate microwave energy, but also to excite the plasma.

Advantageously, each exciter 13 passes right through at least one of the two enclosures 1 and 4, and preferably through both of them. Thus, as can be seen more clearly in FIG. 1, each exciter passes through the gastight top wall 1₂ of the enclosure 1 and through the gastight bottom wall 4₁ of the enclosure 4. As a result, cooling fluid can be caused to flow in a single direction along the inside of each exciter 13 which is in the form of a tube.

When the exciters go through one gastight wall only, each exciter 13 may be shaped either in the form of two tubes to allow cooling fluid flow in two directions or else to be constituted by a heat pipe which is closed at one of its ends.

If the exciters do not pass through any of the gastight walls, then cooling may be provided through a dielectric.

The device of the invention thus makes it possible to use exciters which are totally independent from one another but over which the microwave power is distributed evenly, thereby improving coupling and thus microwave efficiency. Further, the implementation of such exciters which are preferably rectilinear does not require any difficult assembly operations to be performed.

Figure 4:
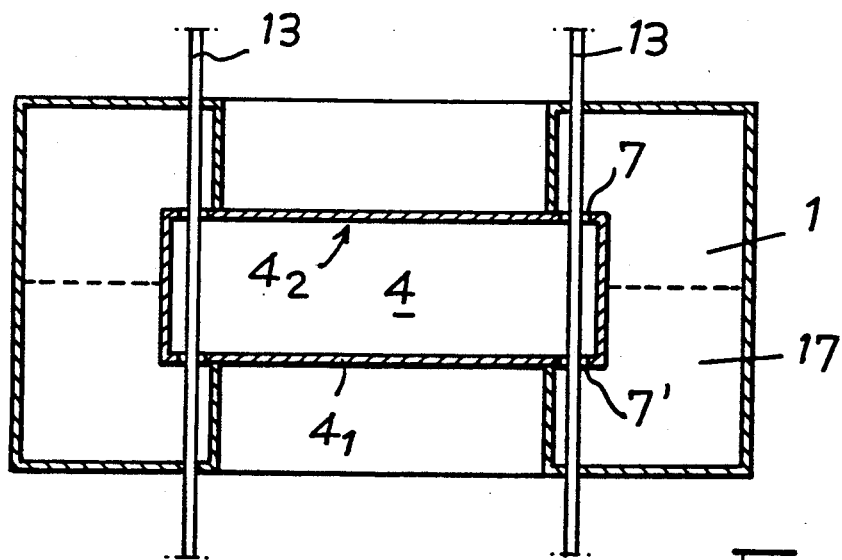
FIG. 4 is a diagrammatic radial section through another embodiment of the invention.

FIG. 4 shows a different embodiment of the device of the invention in which the exciters 13 may be coupled with microwave energy at each end.

To this end, the second enclosure 4 includes a second series of at least one communication passage 7' identical in shape, function, and number to the passages 7 in the first series. These passages 7' which are provided through the bottom wall 4₁ in the example shown provide sealed communication with an enclosure 17 whose inside is bathed in microwave energy.

This enclosure 17 may advantageously be formed by the first enclosure 1 which then has a special shape so as to extend over both the top and the bottom walls of the enclosure 4. The special shape of this enclosure is preferably toroidal so as to make it possible to observe the inside of the enclosure 4.

Naturally, as shown in discontinuous lines in FIG. 1, the enclosure 17 could constitute an enclosure independent from the enclosure 1, and may be of diverse shapes as described above.

It should be observed that the exciters 13 pass through the gastight walls of the enclosures 1 and/or 17 as a function of the type of cooling chosen.

As can be seen more clearly in FIG. 3, the device of the invention may include an improvement for distributing and confining microwaves along the entire portion of the exciter located in the plasma production enclosure.

To this end, each exciter 13 has at least that portion of its length located in the second enclosure 4 positioned at a distance from at least one metal surface 18 whose right cross-section includes at least a concave portion facing the exciter. The surface 18 is constituted by the bottom of a groove 20 formed in the wall 4₃ of the enclosure 4 and having a profile in right cross-section which is concave where it faces the exciter. The profile of the groove 20 may have any concave shape, e.g. it may be circular. As a result, the microwave energy is allowed to propagate in zones which are not subjected to resonance, thereby obtaining microwave energy propagation having minimum losses. In addition, the exciter 13 is thus located closer to the magnet without significantly weakening the wall of the enclosure, thereby making it possible to use less powerful magnets for a given resonance value to be achieved.

The metal surface 18 may also include the front face of a reflector 21 mounted on the opposite side of the exciter 13 from the wall 4₃. The reflector serves to confine microwave energy in the propagation zone and to block the paths of electrons straying too far away from the enclosure wall. In order to perform such a function, the reflector 21 may have a profile in right cross-section of various different shapes, such as rectilinear or convex facing the exciter.

Naturally, an exciter 13 may be placed in association with a groove 20 and/or with a reflector 21.

The grooves 20 and/or the reflectors 21 are preferably designed to ensure a flow of cooling fluid. If the exciters 13 do not go through any of the gastight walls of the enclosures, cooling may be provided via a dielectric and in particular from the surface 18 of the reflector 21.

The device of the invention also includes non-magnetic elements 23 mounted on the inside face of the wall 4₃ of the enclosure 4 between respective pairs of adjacent grooves 20. Each element 23 is in the form of a convex profile facing the inside of the enclosure. The profile of the element is designed so as to avoid secondary scalloping of the magnetic fields that could give rise to ions in the proximity of the wall.

The invention is not limited to the embodiments described and shown since numerous modifications can be made thereto without going beyond the scope of the invention.

We claim:

1. A device for coupling microwave energy with at least one exciter and for distributing it therealong, for the purpose of producing a plasma, the device comprising:

a first enclosure having at least two walls interconnected by a side wall a microwave generator for injecting microwave energy inside the first enclosure;

a second enclosure containing a gaseous medium to be ionized and having at least two walls interconnected by a side wall;

a first series of at least one communication passage formed between one of said two walls of said first enclosure and one of said two walls of the second enclosure; and an exciter passing through each communication passage at a distance from the inside surface thereof, to extend firstly at least inside the first enclosure close to said side wall of said first enclosure to couple with a portion of the microwave energy in said first enclosure, and secondly at least inside the second enclosure in the vicinity of said side wall of said second enclosure to convey the coupled microwave energy from said first enclosure locally into association with the gaseous medium, such that the exciter constitutes, together with the passage and portions of the walls of the enclosures facing the exciter, a coaxial type structure.

2. A device according to claim 1, wherein each exciter is positioned close to a surface having a constant magnetic field as created by a permanent magnet and whose strength corresponds to electron cyclotron resonance.

3. A device according to claim 1, wherein the second enclosure includes a second series of at least one communication passage with a third enclosure whose inside is bathed in microwave energy, in such a manner that each exciter passes right through the second enclosure via corresponding ones of the communication passages in each of the series.

4. A device according to claim 1, including a series of exciters distributed around the periphery of and along the walls of the enclosures facing the exciters.

5. A device according to claim 3, wherein the third enclosure is formed by a portion of the first enclosure.

6. A device according to claim 3, wherein the third enclosure constitutes an enclosure which is independent from the first enclosure.

7. A device according to claim 3, wherein each exciter passes right through at least one of the first and third enclosures so as to enable cooling fluid to be caused to flow along the exciter from outside said at least one of the first and third enclosures.

8. A device according to claim 1, wherein at least one of the enclosures is constituted in the form of a torus.

9. A device according to claim 1, wherein each of the enclosures includes at least one plane face.

10. A device according to claim 3, wherein each communication passage in at least one of the series is constituted by a tubular duct.

11. A device according to claim 1, wherein each exciter is positioned over at least a portion of its length in the second enclosure in association with and at a distance from at least one metal surface including a profile whose right cross-section includes at least one concave portion facing the exciter.

12. A device according to claim 11, wherein one of the metal surfaces is constituted by a bottom of a groove formed in the wall of the second enclosure facing the exciter and having a profile in right cross-section which is concave.

13. A device according to claim 11, wherein one of the metal surfaces is constituted by a front face of a reflector placed on the opposite side of the exciter to the wall of the second enclosure facing the exciter, thereby confining the microwave energy.

14. A device according to claim 11, wherein each exciter is positioned in association with and at a distance from both a groove formed in the wall of the second enclosure facing the exciter and a reflector positioned on the opposite side of the exciter to the wall of the second enclosure facing the exciter.

15. A device according to claim 12, including a non-magnetic element between each pair of successive grooves, the non-magnetic element being carried by the wall of the second enclosure facing the exciter and including a convex profile facing towards the inside of the second enclosure.

16. A device according to claim 14, including a non-magnetic element between each pair of successive grooves, the non-magnetic element being carried by the wall of the second enclosure facing the exciter and including a convex profile facing towards the inside of the second enclosure.

* * * * *